(12) United States Patent
Karstens

(10) Patent No.: US 10,904,662 B2
(45) Date of Patent: Jan. 26, 2021

(54) FREQUENCY-BASED AUDIO AMPLIFICATION

(71) Applicant: International Business Machines Corporation, Armonk, NY (US)

(72) Inventor: Christopher Kent Karstens, Miami Beach, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/357,363

(22) Filed: Mar. 19, 2019

(65) Prior Publication Data

US 2020/0304910 A1    Sep. 24, 2020

(51) Int. Cl.
*H04R 3/04* (2006.01)
*H03G 3/20* (2006.01)

(52) U.S. Cl.
CPC ............ *H04R 3/04* (2013.01); *H03G 3/20* (2013.01)

(58) Field of Classification Search
CPC .................................... H04R 3/04; H03G 3/20
See application file for complete search history.

(56) References Cited

U.S. PATENT DOCUMENTS

| 9,100,859 | B2 | 8/2015 | Jagger et al. |
| 9,609,424 | B2 | 3/2017 | Goldstein |
| 9,704,478 | B1 | 7/2017 | Vitaladevuni et al. |
| 2007/0022869 | A1* | 2/2007 | Lechner ............... H04R 3/04 84/645 |
| 2010/0284528 | A1* | 11/2010 | Bongiovi ........ H04L 25/03012 379/207.16 |
| 2014/0372111 | A1 | 12/2014 | Trammell |
| 2017/0055098 | A1* | 2/2017 | Lim .................... H04S 7/303 |
| 2019/0103849 | A1* | 4/2019 | Shaya ................ H04R 29/001 |

* cited by examiner

*Primary Examiner* — Ping Lee
(74) *Attorney, Agent, or Firm* — Scott S. Dobson

(57) ABSTRACT

A speaker's output volume is increased by obtaining, from a memory, a frequency response curve associated with a speaker. A digital signal processor determines, according to the frequency response curve, a frequency range associated with the speaker's max output volume and designates the frequency range associated with the speaker's max output volume as the target frequency. The digital signal processor remaps in real-time an audio input signal to produce an audio output, from the speaker, in the target frequency.

16 Claims, 4 Drawing Sheets

FREQUENCY-BASED AUDIO AMPLIFICATION

BACKGROUND

The present disclosure relates to frequency adjustment, and more particular aspects relate to improving speaker efficiency using real-time frequency adjustment.

Despite advances in audio technology, speakers continue to be a device where "bigger is better." Due to the waveform nature of sound, larger speaker components, such as cones, are often necessary to produce an even, high quality sound output across a wide range of frequencies.

SUMMARY

According to embodiments of the present disclosure, computer-implemented method for increasing a speaker's output volume is described. A frequency response curve associated with a speaker is obtained from a memory. A digital signal processor determines, according to the frequency response curve, a frequency range associated with the speaker's max output volume and designates the frequency range associated with the speaker's max output volume as the target frequency. An audio input received, e.g., by a microphone, over a network, etc., is remapped in real-time using the digital signal processor, to produce an audio output in the target frequency.

A system for increasing a speaker's output volume is described herein according to embodiments of the present disclosure. The system comprises a speaker, a microphone, a digital signal processor (DSP), and a memory coupled to the DSP. The memory comprises instructions which are executed by the DSP. In embodiments, system components may be physically or remotely connected, e.g., via a wireless or cellular network.

The DSP obtains, from the memory, a frequency response curve associated with the speaker. A frequency range associated with the speaker's maximum output volume is determined according to the frequency response curve. The frequency range associated with the speaker's maximum output volume is designated as the target frequency. The DSP receives an audio input signal from the microphone, either directly or via a network, e.g., a wireless or cellular network, and remaps the audio input in real-time to produce an audio output, by the speaker, in the target frequency.

A computer program product for increasing a speaker's output volume is described according to embodiments of the present disclosure. The computer program product is disposed upon a computer-readable storage medium and comprises computer program instructions that, are executed by a digital signal processor as described above.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
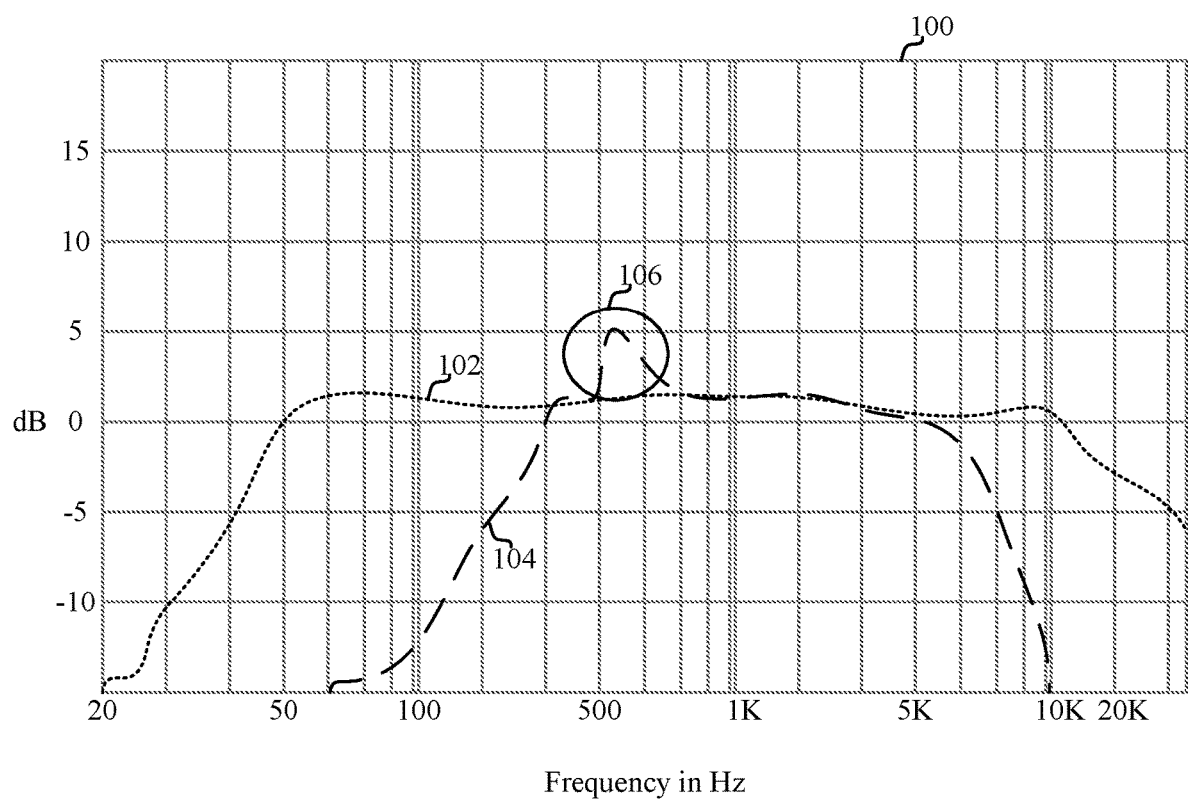
FIG. 1 depicts a frequency response curve of a speaker, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to real-time frequency adjustment; and more particular aspects relate to improving speaker efficiency using real-time frequency adjustment. While the present disclosure is not necessarily limited to such applications, various aspects of the disclosure may be appreciated through a discussion of various examples using this context.

In general, mobile speakers, whether a standalone portable speaker or a speaker integrated into a portable device, such as a phone, watch, table, laptop, etc., are very small speakers which are often constructed with low-quality parts due to size and cost constraints. It is not uncommon for even high-end smartphones to have integrated speakers of such poor quality as to be unusable when background noise is present. Size can be a major limiting factor in speaker quality, particularly for integrated speakers with limited space constraints.

Since these constraints are largely fixed by the nature of a portable product, speaker improvement must be achieved by finding a way to "do more" within the space constraints of the associated hardware. Disclosed herein are embodiments of a computer-implemented method for maximizing speaker output efficiency. By taking advantage of a speaker's "sweet spot," a frequency range in which the volume has a natural tendency to be loudest, improved speaker performance can be achieved with existing hardware through digital signal processing.

Embodiments of the disclosed method include the steps of obtaining a frequency response curve associated with a speaker, determining, according to the frequency response curve, a frequency range associated with the speaker's maximum output volume, designating the frequency range associated with the speaker's max output volume as the target frequency, receiving audio input, and remapping the audio input in real-time to produce an audio output in the target frequency. The disclosed method may be embodied within a computer program product.

In embodiments, obtaining the frequency response curve associated with the speaker may comprise receiving the frequency response curve from a speaker manufacturer associated with the speaker. In embodiments, the frequency response curve may be received in a binary file profile or may be generated by a local or remote device. In embodiments, remapping the audio input in real-time to produce an audio output in the target frequency may be performed locally or remotely, for example the remapping may be performed using a cloud service.

Embodiments of the present disclosure may include a system comprising a speaker, a microphone, a digital signal processor, and a memory coupled to the digital signal processor. System components may be physically connected or may be remote from one another and communicate via a network, e.g., a wireless or cellular network. The memory comprises instructions which, when executed by the digital signal processor, cause the digital signal processor to obtain a frequency response curve associated with a speaker, determine, according to the frequency response curve, a frequency range associated with the speaker's maximum output volume, designate the frequency range associated with the speaker's maximum output volume as the target frequency, receive audio input, and remap the audio input in real-time to produce an audio output in the target frequency.

Referring now to FIG. 1, a frequency response graph 100 is depicted according to embodiments of the present disclosure. Graph 100 shows the relationship between frequency in Hertz (Hz) on the X-axis and volume in decibels (dB) on the Y-axis. Curve 102 on graph 100 depicts the expected frequency-response for a large, high-quality speaker. Curve 102 is generally relatively flat (even dB or volume) across a wide range of frequencies. Curve 104 on graph 100 is an expected frequency response curve for the kind of small, low-quality speaker that is typically found in portable electronic devices. Curve 104 not only covers a smaller frequency range than curve 102, but it is not "flat;" it does not achieve uniform volume across the frequencies of sound that it does produce. Specifically, there is a volume peak 106, or "sweet spot," at approximately 500-600 Hz where the speaker achieves its maximum volume.

Frequency response graphs, like graph 100, can be used to generate a speaker profile for a speaker identifying the specific dB-Hz relationship for that particular speaker. In some embodiments, the speaker profile data can be organized into structured data blocks and provided by the manufacturer as a binary file profile. The binary file profile may identify a number of different specifications for the associated speaker. In some embodiments, the speaker profile may be generated locally or remotely based upon a received or generated frequency response curve associated with the speaker.

A single device (e.g., a cell phone) can have multiple frequency profiles (onboard cell phone speaker, external wireless Bluetooth speaker, wired headphones, etc.) and may store or access multiple speaker profiles depending on the available audio output options. As a user cycles between a device's different speakers (e.g., plugs in headphones) the device may automatically shift to utilizing a different frequency profile. In embodiments, a device may store any number of speaker profiles locally, e.g., for integrated speakers, and may also be capable of retrieving remotely stored speaker profiles, e.g., for external speaker or headphones.

Figure 2:
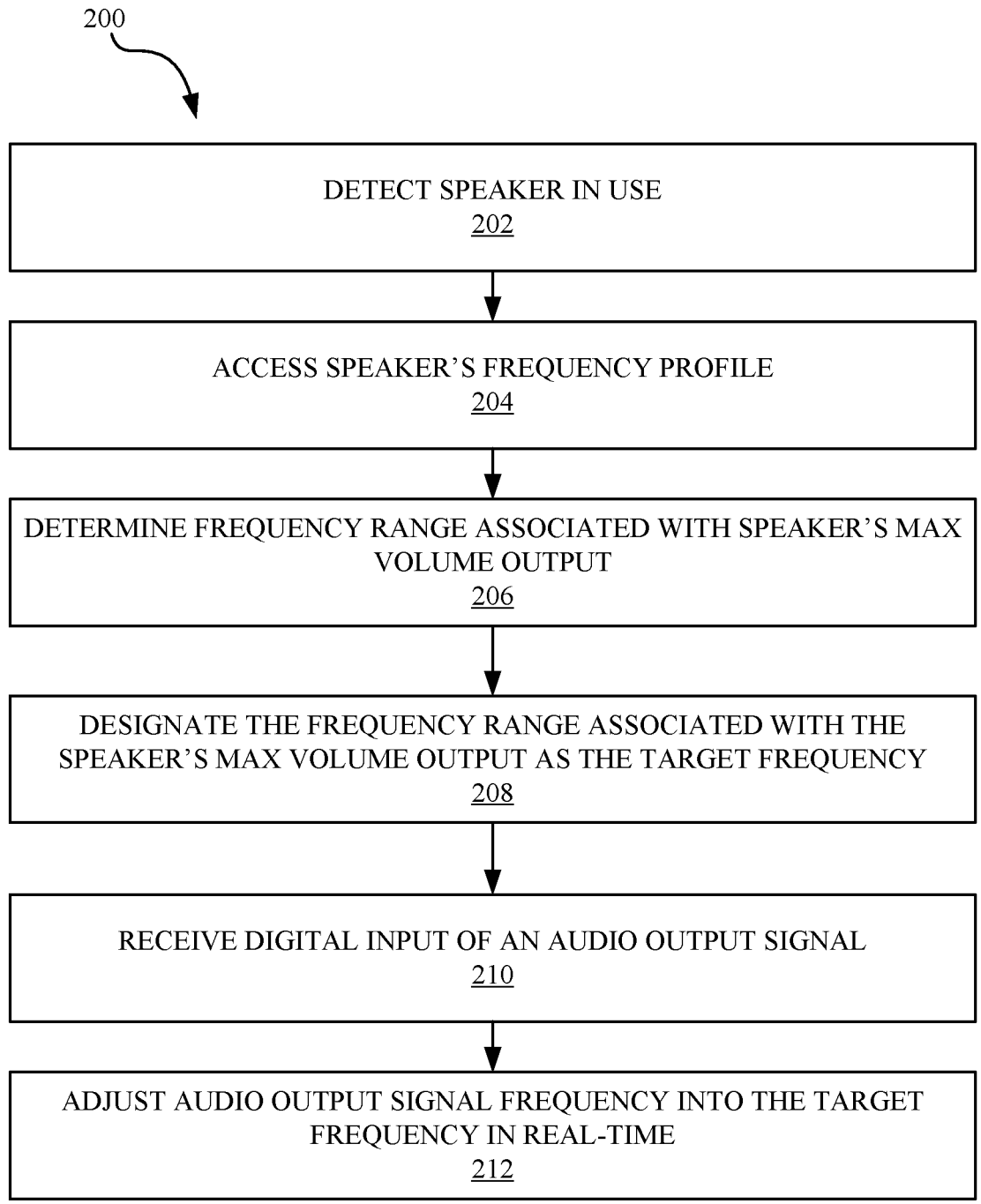
FIG. 2 depicts an example method for adjusting a speaker's frequency in real time, according to embodiments of the present disclosure.

Referring now to FIG. 2, depicted is an example method 200 for adjusting audio frequency in real time, according to embodiments of the present disclosure.

Beginning with operation 202, a device (e.g., a cell phone) detects a speaker which is in use. In embodiments, the device may have a setting indicating a default speaker (e.g., an integrated speaker) to use in the event that a particular speaker is not detected. Having identified the speaker to be used, the device accesses the speaker's associated frequency profile, as in operation 204. The profile may be accessed locally on the device or remotely, e.g., a remote storage device, the cloud, stored on the speaker itself, etc.

Using the frequency profile, a frequency range associated with the speaker's max volume output is determined, as in operation 206. In embodiments, the frequency range may be explicitly identified as part of the frequency profile, or the device may determine the frequency range through analysis of a frequency response curve stored within the profile. Once identified, the device may designate the frequency range associated with the speaker's max volume as the target frequency, as in operation 208. In embodiments, the frequency range may already be identified at the target frequency within the frequency profile itself.

The device receives a digital input for conversion to an audio output signal, as at operation 210. In embodiments, the input signal may instead be analog and accordingly undergo analog-to-digital conversion or analog signal processing. The device may perform digital signal processing to enable audio output of the received signal. The digital signal processing includes a real-time frequency shift of the received signal into the target frequency range, as in operation 212. This may result in some distortion of the output sound as frequency determines the particular pitch of the sound, but in exchange provides a volume boost with existing speaker components and specifications since all sounds emitted are in the speaker's "sweet spot" or loudest frequency range. This can be a default setting, e.g., for persons who are hard of hearing, or an optional setting, e.g., for persons using their phones in an area with significant background noise.

Due to this trade-off between volume and sound integrity, the disclosed method may be best utilized for "narrow frequency" audio, e.g., speech or ringer tones. Such functional audio may offset any inconvenience caused by the sound distortion with the utility provided. Other, "wide frequency" audio, such as most music, may not fit within the narrow frequency range of a small speaker's "sweet spot."

Figure 3:
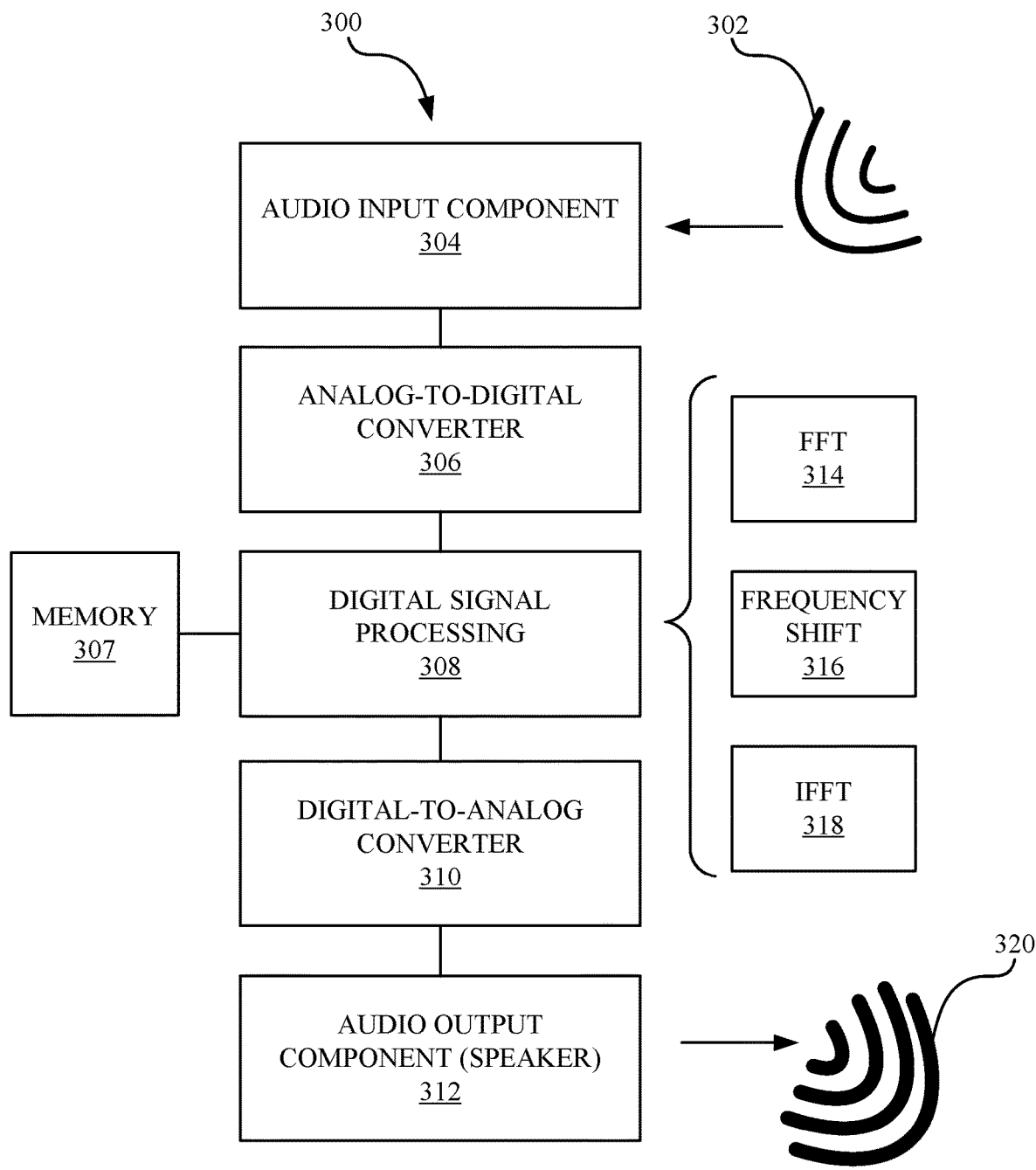
FIG. 3 depicts a block diagram of a system for executing the disclosed method, according to embodiments of the present disclosure.

Referring now to FIG. 3, a block diagram 300 of an example system for executing the disclosed method is depicted, according to embodiments of the present disclosure.

Block diagram 300 presents an expected component flow beginning with audio input component 304. In embodiments, audio input component 304 may comprise any functional audio capture device, but may generally represent some kind of microphone. The audio input component 304 generates an analog signal of the detected audio input 302. The analog signal of the detected audio input 302 is converted to a digital signal by the analog-to-digital converter (ADC) 306.

The digital signal of the detected audio input 302 is received by digital signal processing unit (DSP) 308. DSP 308 performs the real time frequency, and corresponding volume, shift of the detected audio input 302. DSP 308 may generally represent the primary location for the execution of example method 200 from FIG. 2. In embodiments, DSP 308 may store locally, for example in a memory 307, or access remotely the appropriate frequency response curve, such as curve 104 of FIG. 1, and frequency profile of the target audio output device. The DSP 308 may be performed locally on the audio device or remotely, e.g., in a cloud processor. DSP is highly flexible and permits a variety of options for performing the disclosed processing. Example method 300 presents one possible example for digital signal processing using a fast Fourier transformation (FFT) 314, a frequency shift 316, and an inverse fast Fourier transformation (IFFT) 318.

After processing of the digital signal is complete, the signal is converted back to analog by a digital-to-analog converter 310. The analog signal is then output by an audio output component 312, such as a speaker. The output 320 of the speaker may not be a completely faithful reproduction of audio input 302, due to the frequency shift, but it will be the loudest possible output that the audio output component 312 can produce.

Figure 4:
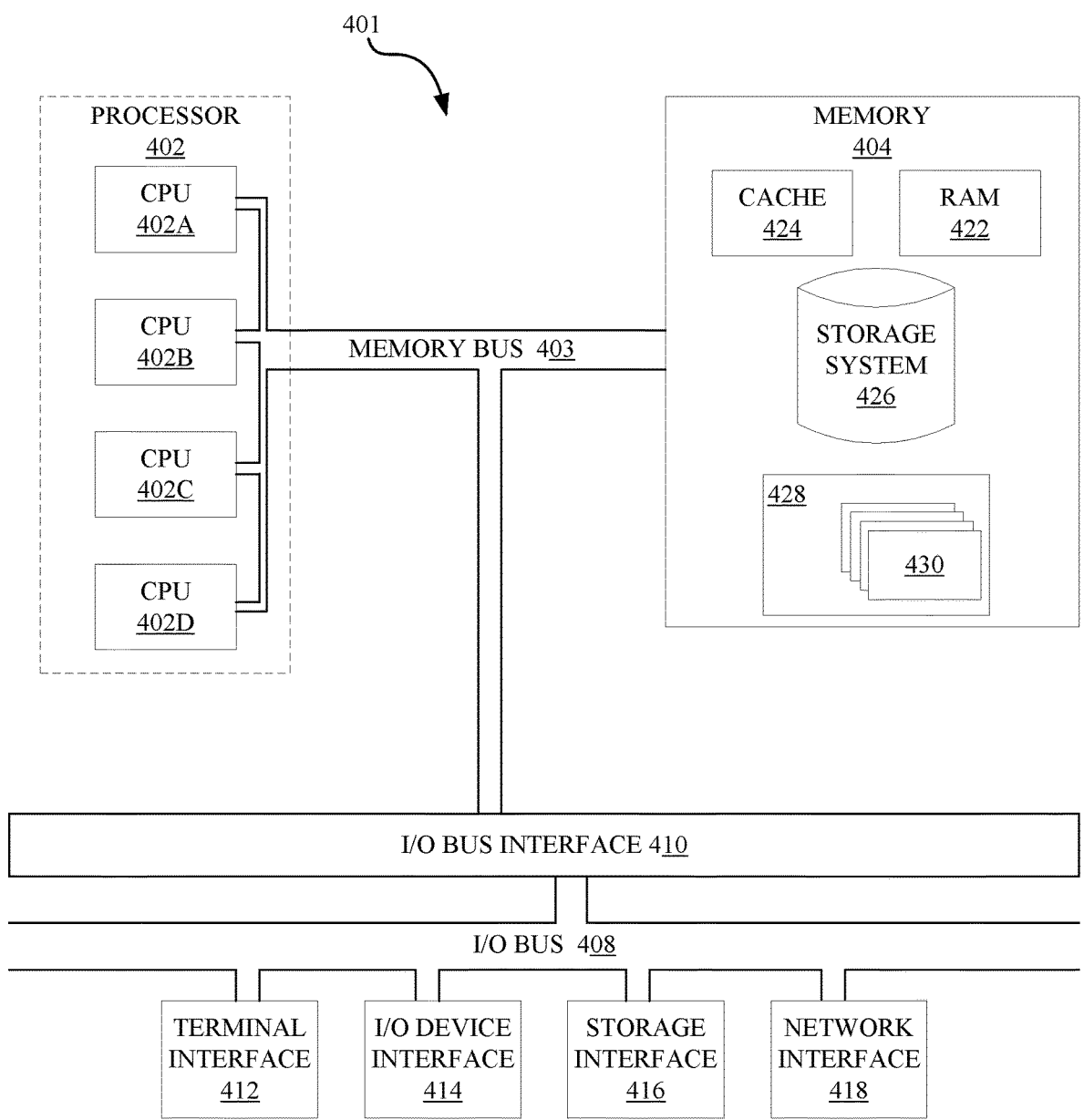
FIG. 4 depicts a high-level block diagram of an example computer system that may be used in implementing one or more of the methods, tools, and modules, and any related functions, described herein, according to embodiments of the present disclosure.

Referring now to FIG. 4, shown is a high-level block diagram of an example computer system 401 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 401 may comprise one or more CPUs 402, a memory subsystem 404, a terminal interface 412, a storage interface 416, an I/O (Input/Output) device interface 414, and a network interface 418, all of which may be communicatively coupled, directly or indirectly, for inter-component communication via a memory bus 403, an I/O bus 408, and an I/O bus interface unit 410.

The computer system 401 may contain one or more general-purpose programmable central processing units (CPUs) 402A, 402B, 402C, and 402D, herein generically referred to as the CPU 402. In some embodiments, the computer system 401 may contain multiple processors typical of a relatively large system; however, in other embodiments the computer system 401 may alternatively be a single CPU system. Each CPU 402 may execute instructions stored in the memory subsystem 404 and may include one or more levels of on-board cache.

System memory 404 may include computer system readable media in the form of volatile memory, such as random access memory (RAM) 422 or cache memory 424. Computer system 401 may further include other removable/non-removable, volatile/non-volatile computer system storage media. By way of example only, storage system 426 can be provided for reading from and writing to a non-removable, non-volatile magnetic media, such as a "hard drive" or a magnetic tape drive. Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 404 can include flash memory, e.g., a flash memory stick drive or a flash drive. Memory devices can be connected to memory bus 403 by one or more data media interfaces. The memory 404 may include at least one program product having a set (e.g., at least one) of program modules that are configured to carry out the functions of various embodiments.

Although the memory bus 403 is shown in FIG. 4 as a single bus structure providing a direct communication path among the CPUs 402, the memory subsystem 404, and the I/O bus interface 410, the memory bus 403 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 410 and the I/O bus 408 are shown as single units, the computer system 401 may, in some embodiments, contain multiple I/O bus interface units 410, multiple I/O buses 408, or both. Further, while multiple I/O interface units are shown, which separate the I/O bus 408 from various communications paths running to the various I/O devices, in other embodiments some or all of the I/O devices may be connected directly to one or more system I/O buses.

In some embodiments, the computer system 401 may be a multi-user mainframe computer system, a single-user system, or a server computer or similar device that has little or no direct user interface, but receives requests from other computer systems (clients). Further, in some embodiments, the computer system 401 may be implemented as a desktop computer, portable computer, laptop or notebook computer, tablet computer, pocket computer, telephone, smart phone, network switches or routers, or any other appropriate type of electronic device. It is noted that FIG. 4 is intended to depict the representative major components of an exemplary computer system 401. In some embodiments, however, individual components may have greater or lesser complexity than as represented in FIG. 4, components other than or in addition to those shown in FIG. 4 may be present, and the number, type, and configuration of such components may vary.

One or more programs/utilities 428, each having at least one set of program modules 430 may be stored in memory 404. The programs/utilities 428 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 428 and/or program modules 430 generally perform the functions or methodologies of various embodiments.

In some embodiments, the modules 430 may include instructions that perform the steps of the process, such as process 200 shown in FIG. 2.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method for increasing a speaker's output volume, the method comprising:
   obtaining, from a memory, a frequency response curve associated with a first speaker;
   determining, by a digital signal processor, according to the frequency response curve, a first narrow frequency range defining a volume peak where the first speaker achieves its maximum volume, wherein a width of the first narrow frequency range is approximately 100 Hz at approximately 500-600 Hz;
   designating, by the digital signal processor, the first narrow frequency range as the first target frequency;
   receiving, by the digital signal processor, audio input;
   shifting, by the digital signal processor and based on an optional user setting, frequency of the audio input in real-time to produce an audio output in the first target frequency; and
   in response to a user cycling from the first speaker to a second speaker, shifting, by the digital signal processor, frequency of the audio input in real-time to produce an audio output in a second target frequency, the second target frequency being within a second narrow frequency range defining a volume peak where the second speaker achieves its maximum volume, wherein the first speaker is an integrated speaker and the second speaker is an external speaker.

2. The computer-implemented method of claim 1, wherein obtaining the frequency response curve associated with the first speaker comprises receiving the frequency response curve from a speaker manufacturer associated with the first speaker.

3. The computer-implemented method of claim 2, wherein the frequency response curve is received in a binary file profile.

4. The computer-implemented method of claim 1, wherein obtaining the frequency response curve associated with the first speaker comprises generating the frequency response curve.

5. The computer-implemented method of claim 1, wherein shifting frequency of the audio input in real-time to produce an audio output in the first target frequency is performed locally.

6. The computer-implemented method of claim 1, wherein shifting frequency of the audio input in real-time to produce an audio output in the first target frequency is performed remotely.

7. The computer-implemented method of claim 6, wherein remotely refers to performing the shifting using a cloud service.

8. A system for increasing a speaker's output volume, the system comprising:
   a first speaker;
   a second speaker;
   a microphone,
   a digital signal processor; and
   a memory coupled to the digital signal processor, wherein the memory comprises instructions which, when executed by the digital signal processor, cause the digital signal processor to:
   obtain, from the memory, a frequency response curve associated with the first speaker;
   determine, according to the frequency response curve, a first narrow frequency range defining a volume peak where the speaker achieves its maximum volume, wherein a width of the first narrow frequency range is approximately 100 Hz at approximately 500-600 Hz;
   designate the first narrow frequency range as the first target frequency;
   receive an audio input;
   shift, based on an optional user setting, frequency of the audio input in real-time to produce an audio output, by the first speaker, in the first target frequency; and
   in response to a user cycling from the first speaker to the second speaker, shift the frequency of the audio input in real-time to produce an audio output in a second target frequency, the second target frequency being within a second narrow frequency range defining a volume peak where the second speaker achieves its maximum volume, wherein the first speaker is an integrated speaker and the second speaker is an external speaker.

9. The system of claim 8, wherein the digital signal processor obtains the frequency response curve associated with the first speaker by receiving the frequency response curve from a speaker manufacturer associated with the first speaker.

10. The system of claim 9, wherein the digital signal processor receives the frequency response curve in a binary file profile.

11. The system of claim 8, wherein the digital signal processor obtains the frequency response curve associated with the speaker by generating the frequency response curve.

12. The system of claim 8, wherein the digital signal processor remaps the audio input in real-time to produce an audio output in the first target frequency locally.

13. The system of claim 8, wherein the digital signal processor remaps the audio input in real-time to produce an audio output in the first target frequency remotely.

14. The system of claim 13, wherein remotely refers to performing the remapping using a cloud service.

15. A computer program product for increasing a speaker's output volume, the computer program product comprising a computer readable storage medium, the computer readable storage medium having program instructions embodied therewith, the program instructions executable by a computer to cause the computer to:

obtain a frequency response curve associated with a first speaker;

determine, according to the frequency response curve, a first narrow frequency range defining a volume peak where the speaker achieves its maximum volume, wherein a width of the first narrow frequency range is approximately 100 Hz at approximately 500-600 Hz;

designate the first narrow frequency range as the first target frequency;

receive audio input;

shift, based on an optional user setting, frequency of the audio input in real-time to produce an audio output in the first target frequency; and in response to a user cycling from the first speaker to a second speaker, shift, by the frequency of the audio input in real-time to produce an audio output in a second target frequency, the second target frequency being within a second narrow frequency range defining a volume peak where the second speaker achieves its maximum volume, wherein the first speaker is an integrated speaker and the second speaker is an external speaker.

16. The computer program product of claim 15, wherein the digital signal processor obtains the frequency response curve associated with the first speaker by receiving the frequency response curve from a speaker manufacturer associated with the first speaker.

* * * * *